(12) United States Patent
Mitsuyama et al.

(10) Patent No.: US 7,489,076 B2
(45) Date of Patent: Feb. 10, 2009

(54) LIGHT EMITTING DIODE PACKAGE INCLUDING BASE BODY WITH THERMAL VIA AND LIGHT EMITTING DIODE USING THE SAME

(75) Inventors: Kazuma Mitsuyama, Saga-pref (JP); Itsuki Yamamoto, Saga-pref (JP); Kouji Kudo, Saga-pref (JP); Nario Fukumoto, Saga-pref (JP); Hiroyuki Fukae, Saga-pref (JP); Kengo Nishiyama, Saga-pref (JP); Takumi Narita, Aichi-pref (JP); Hiroaki Kawaguchi, Aichi-pref (JP); Toshimasa Hayashi, Aichi-pref (JP)

(73) Assignees: Kyoritsu Elex Co., Ltd., Saga (JP); Toyoda Gosei Co., Ltd., Aichi (JP)

( * ) Notice: Subject to any disclaimer, the term of this patent is extended or adjusted under 35 U.S.C. 154(b) by 366 days.

(21) Appl. No.: 11/391,679

(22) Filed: Mar. 29, 2006

(65) Prior Publication Data
US 2007/0235746 A1     Oct. 11, 2007

(30) Foreign Application Priority Data
Jan. 26, 2006     (JP)     ............... 2006-017726

(51) Int. Cl.
*H01J 1/62*     (2006.01)
(52) U.S. Cl. ..................................... 313/512; 313/498
(58) Field of Classification Search ................. 313/512
See application file for complete search history.

(56) References Cited

U.S. PATENT DOCUMENTS

2005/0269012 A1*  12/2005  Saito ................. 156/89.11
2006/0189129 A1*   8/2006  Baskaran et al. ........ 438/652

FOREIGN PATENT DOCUMENTS

JP          2003-037298        2/2003

* cited by examiner

*Primary Examiner*—Joseph L Williams
(74) *Attorney, Agent, or Firm*—Kubotera & Associates, LLC

(57) ABSTRACT

In a light emitting diode package or a light emitting diode, a cover body having an opening with a reflecting surface is attached on an upper portion of a base body on which a light emitting diode element is mounted. The base body is formed of alumina ceramics having a pore diameter of 0.10 to 1.25 μm or a porosity of 10% or more, and a thermal via is formed in the base body. Accordingly, it is possible to improve luminance and heat radiating characteristics of the light emitting diode package and the light emitting diode which uses alumina ceramics.

12 Claims, 8 Drawing Sheets

LIGHT EMITTING DIODE PACKAGE INCLUDING BASE BODY WITH THERMAL VIA AND LIGHT EMITTING DIODE USING THE SAME

BACKGROUND OF THE INVENTION

1. Field of the Invention

The present invention relates to a light emitting diode package and a light emitting diode which uses such a package, and more particularly to a light emitting diode package which is made of alumina ceramics and a light emitting diode which uses such a package.

2. Description of the Related Art

Conventionally, as a light emitting element which can be manufactured on a mass production basis and can exhibit high luminance and low power consumption, a light emitting diode has been popularly used. Particularly, in recent years, as a light emitting diode which aims at a prolonged life time by enhancing the heat radiation characteristics, a light emitting diode which forms a package thereof using two plate-like alumina ceramics has been used. As such a light emitting diode, there has been known a light emitting diode in which a base body and cover body which are formed of a plate-like ceramics are laminated to each other, a light emitting diode element is mounted on a surface of the base body, and an opening having a tapered reflection surface is formed in an approximately center portion of the cover body (for example, see Japanese Patent Publication No. 2003-37298).

Further, in recent years, along with the development of a blue light emitting diode, the utilization of a light emitting diode which emits light in an ultraviolet region in the manufacture of a semiconductor substrate has been taken into consideration.

Under such circumstances, the light emitting diode which uses alumina ceramics as a raw material is requested to satisfy a demand for further higher luminance.

Further, to satisfy the demand for further higher luminance of the light emitting diode, besides the further higher luminance of a light emitting diode element per se, it is also necessary to enhance the reflectance of a reflecting surface which is formed on a light emitting diode package.

SUMMARY OF THE INVENTION

However, in the conventional light emitting diode which uses alumina ceramics, the reflectance of alumina ceramics per se is low and hence, unless a reflector which exhibits the high reflectance is additionally adhered to a reflecting surface of alumina ceramics, it is difficult to obtain the further higher luminance of the light emitting diode whereby there exists a possibility that the manufacture of the light emitting diode incurs tremendous efforts, time and cost.

In view of the circumstance that the conventional alumina ceramics cannot realize the further higher luminance of the light emitting diode due to the low reflectance, inventors of the present invention have made extensive studies and have achieved following finding. That is, alumina ceramics which have been used for forming the package of the conventional light emitting diode are the widely-and-popularly-used usual ceramics which are obtained by baking at a predetermined sintering temperature. In the manufacturing process of such alumina ceramics, when a diameter of pores and the porosity of alumina ceramics per se are changed by changing the sintering temperature and the composition of a raw material, the reflectance of alumina ceramics per se is largely changed, and alumina ceramics which have the pore diameter and the porosity within predetermined ranges exhibit the practically sufficient reflectance compared to the reflectance of the existing alumina ceramics.

According to a first aspect of the present invention, in a light emitting diode package which adheres a cover body which forms an opening having a reflecting surface on an upper portion of a base body on which a light emitting diode element is mounted, the base body is formed using alumina ceramics having a pore diameter of 0.10 to 1.25 μm, and thermal vias are formed in the base body.

According to a second aspect of the present invention, in a light emitting diode package which adheres a cover body which forms an opening having a reflecting surface on an upper portion of a base body on which a light emitting diode element is mounted, the base body is formed using alumina ceramics having a porosity of 10% or more, and thermal vias are formed in the base body.

In the above-mentioned first and second aspects of the present invention, the thermal vias may be formed at a position right below the light emitting diode element.

Further, in the above-mentioned first and second aspects of the present invention, the light emitting diode element is mounted on the base body by way of a heat radiating body.

According to a third aspect of the present invention, in a light emitting diode which adheres a cover body which forms an opening having a reflecting surface on an upper portion of a base body on which a light emitting diode element is mounted, the base body is formed using alumina ceramics having a pore diameter of 0.10 to 1.25 μm, and thermal vias are formed in the base body.

According to a fourth aspect of the present invention, in a light emitting diode which adheres a cover body which forms an opening having a reflecting surface on an upper portion of a base body on which a light emitting diode element is mounted, the base body is formed using alumina ceramics having a porosity of 10% or more, and thermal vias are formed in the base body.

Further, in the above-mentioned third and fourth aspects of the present invention, the thermal vias may be formed at a position right below the light emitting diode element.

Further, in the above-mentioned third and fourth aspects of the present invention, the light emitting diode element is mounted on the base body by way of a heat radiating body.

In the conventional alumina ceramics, the pore diameter is less than 0.10 μm and porosity is less than 10% and hence, the reflectance with respect to respective wavelengths is 85% or less. However, in the present invention, the pore diameter and the porosity of alumina ceramics are increased by one digit compared to the pore diameter and the porosity of the conventional alumina ceramics. That is, in the present invention, the pore diameter of alumina ceramics is set to a value which falls within a range of 0.10 to 1.25 μm or the porosity of alumina ceramics is set to 10% or more and hence, the reflectance of alumina ceramics per se can be enhanced.

In this manner, according to the present invention, in the light emitting diode package which adheres the cover body which forms the opening having the reflecting surface to the upper portion of the base body on which the light emitting diode element is mounted, alumina ceramics which enhance the reflectance is used as the base body, and the light emitting diode element is arranged above the base body and hence, it is possible to favorably reflect light which is directed downwardly from the light emitting diode element whereby the luminance of the light emitting diode can be enhanced.

Further, although there may exist a possibility that the heat radiation characteristics are lowered due to the reduction of the thermal conductivity attributed to the increase of the pore diameter or the porosity of alumina ceramics, in the present invention, the thermal vias are formed in the base body and hence, it is possible to enhance the heat radiation characteristics of the light emitting diode or the light emitting diode package.

Particularly, when the thermal vias are formed at the position right below the light emitting diode element, a distance between the light emitting diode element and the thermal vias can be shortened and hence, heat generated by the light emitting diode element can be readily transferred to the thermal vias whereby the heat radiating characteristics of the light emitting diode or the light emitting diode package can be further enhanced.

Further, when the light emitting diode element is mounted on the base body by way of the heat radiating body, heat generated by the light emitting diode element can be favorably transferred to the thermal vias whereby it is also possible to further enhance the heat radiating characteristics of the light emitting diode or the light emitting diode package.

DETAILED DESCRIPTION OF PREFERRED EMBODIMENTS

Hereinafter, specific structures of a light emitting diode package and a light emitting diode which uses such a package according to embodiments of the present invention are explained in conjunction with the attached drawings.

Figure 1:
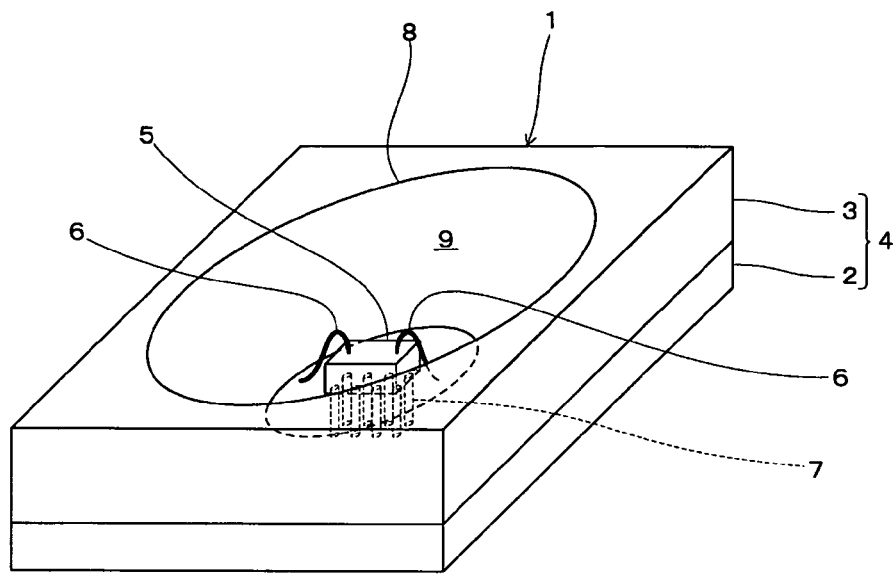
FIG. 1 is a perspective view showing a light emitting diode according to the present invention.
Figure 2:
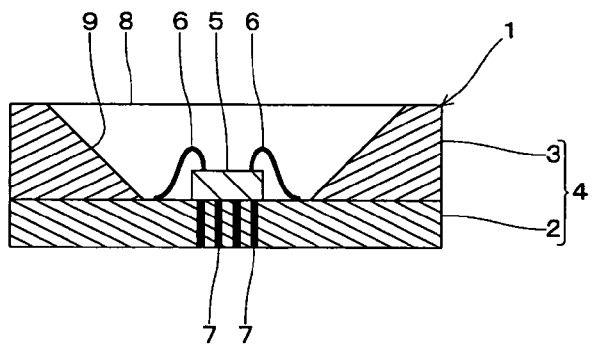
FIG. 2 is a cross-sectional view of the light emitting diode.
Figure 3:
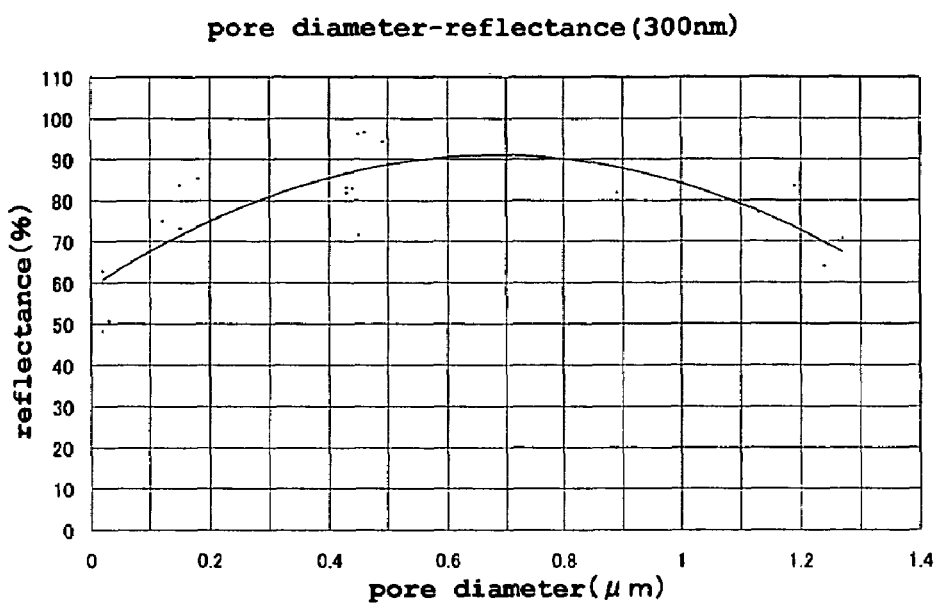
FIG. 3 is a graph showing the relationship between a pore diameter and the reflectance with respect to light having a wavelength of 300 nm.
Figure 4:
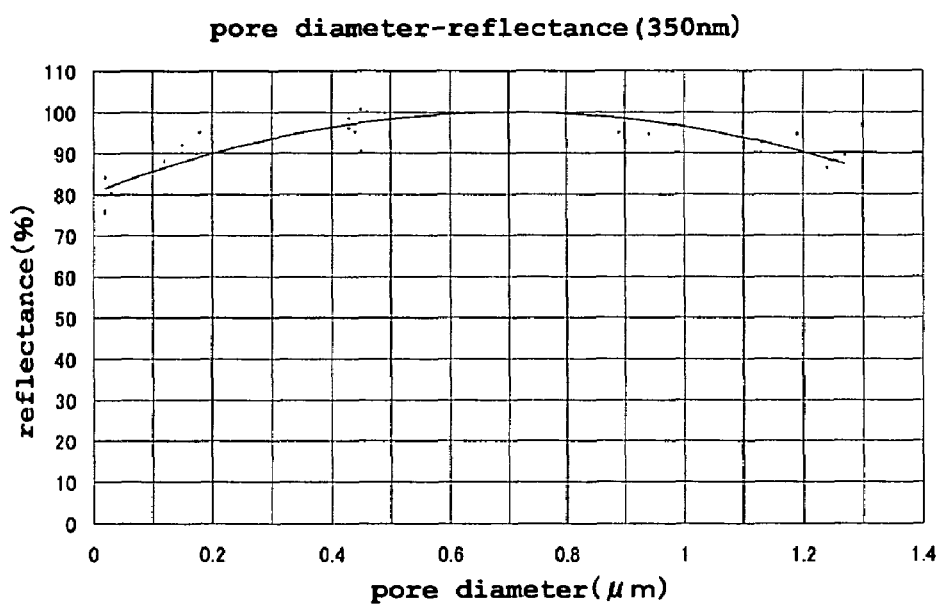
FIG. 4 is a graph showing the relationship between a pore diameter and the reflectance with respect to light having a wavelength of 350 nm.
Figure 5:
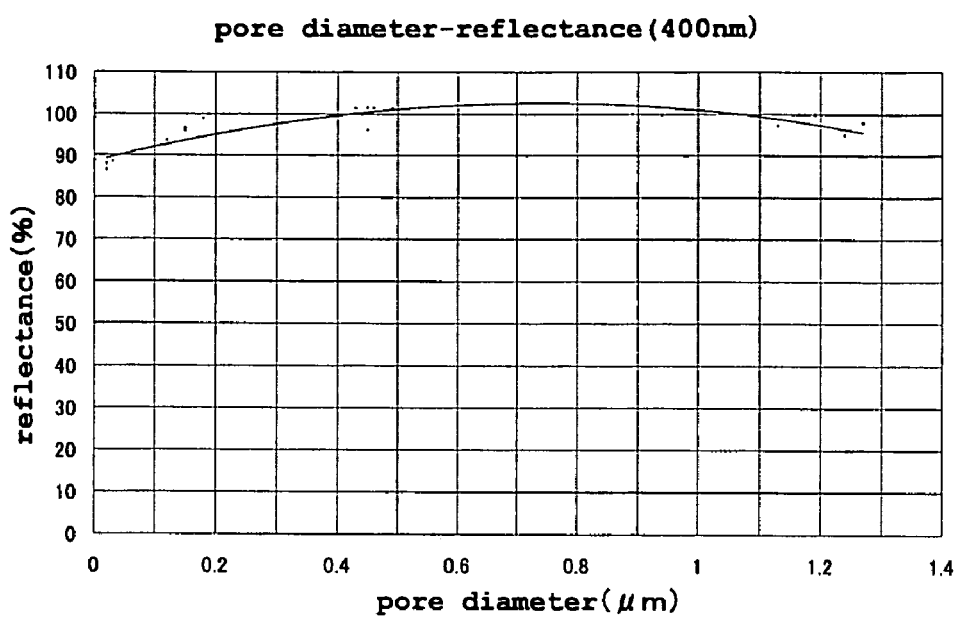
FIG. 5 is a graph showing the relationship between a pore diameter and the reflectance with respect to light having a wavelength of 400 nm.
Figure 6:
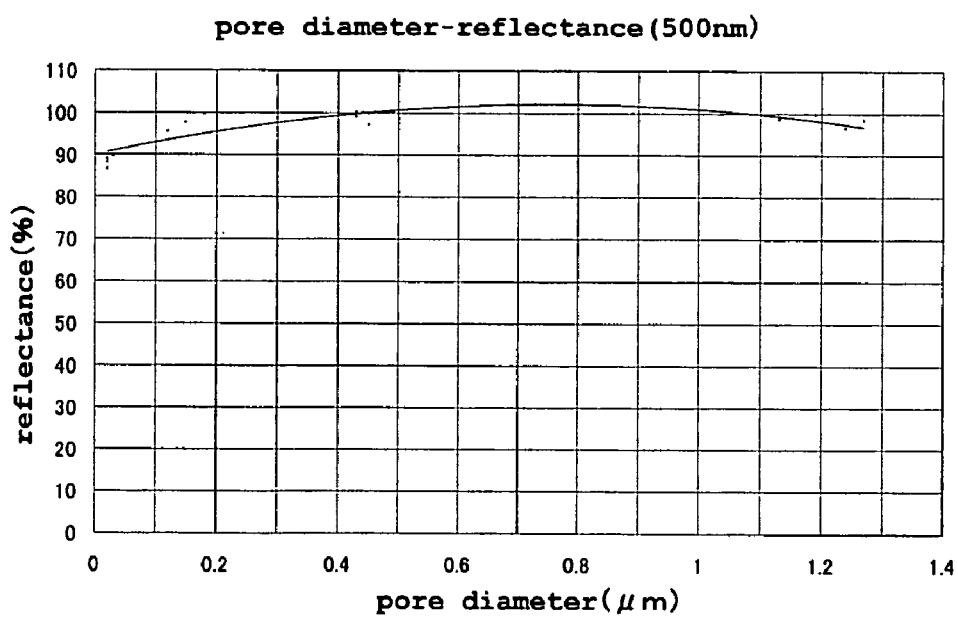
FIG. 6 is a graph showing the relationship between a pore diameter and the reflectance with respect to light having a wavelength of 500 nm.
Figure 7:
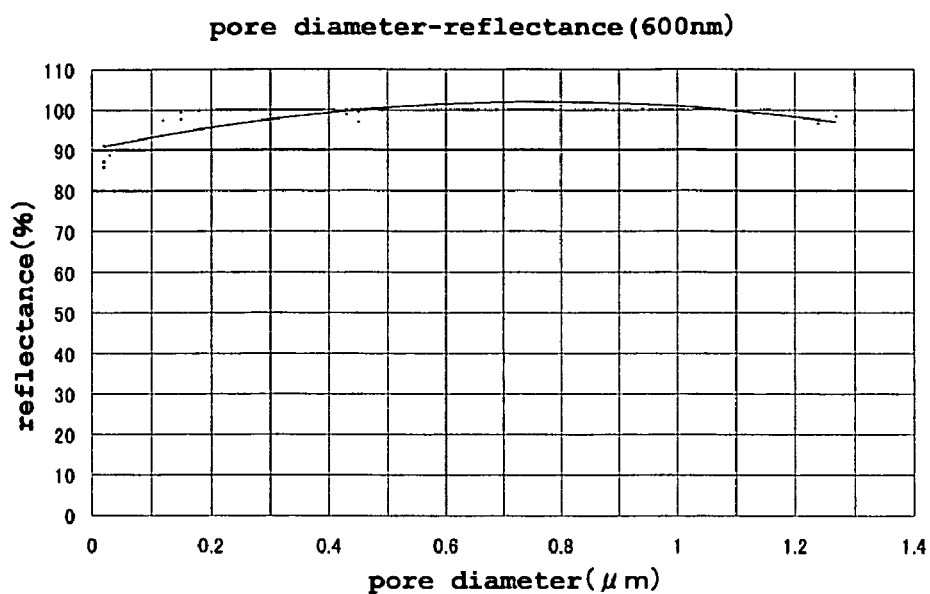
FIG. 7 is a graph showing the relationship between a pore diameter and the reflectance with respect to light having a wavelength of 600 nm.
Figure 8:
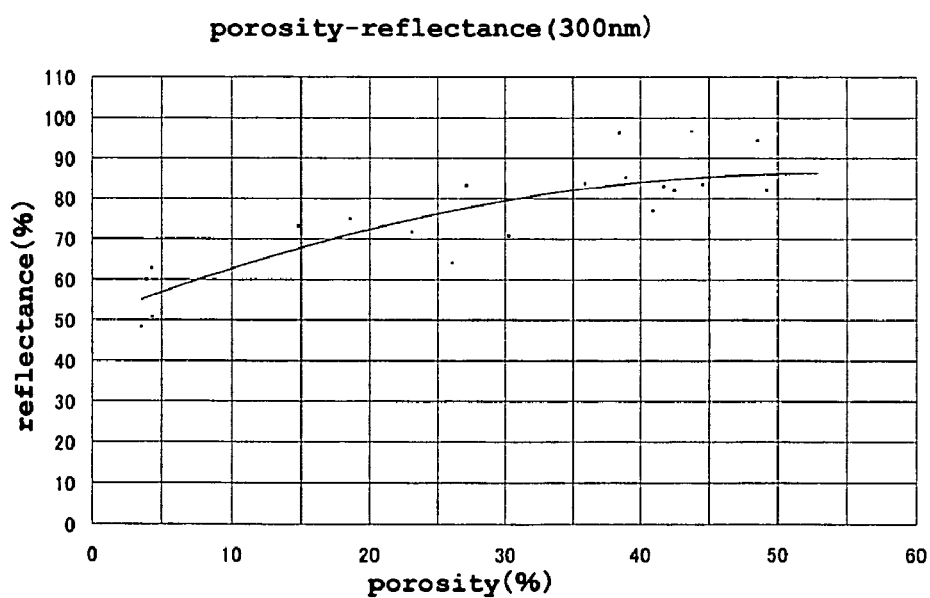
FIG. 8 is a graph showing the relationship between a pore diameter and the reflectance with respect to light having a wavelength of 300 nm.
Figure 9:
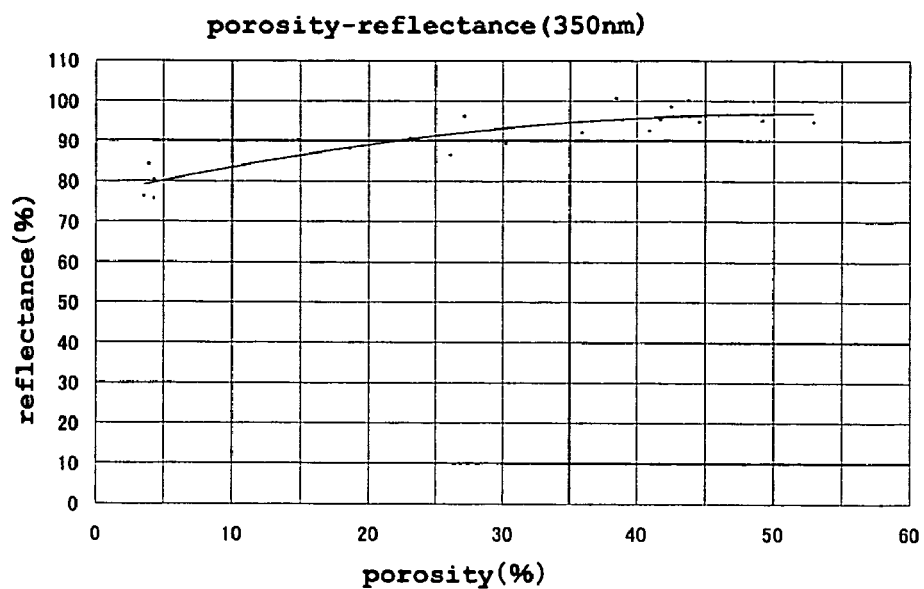
FIG. 9 is a graph showing the relationship between a pore diameter and the reflectance with respect to light having a wavelength of 350 nm.
Figure 10:
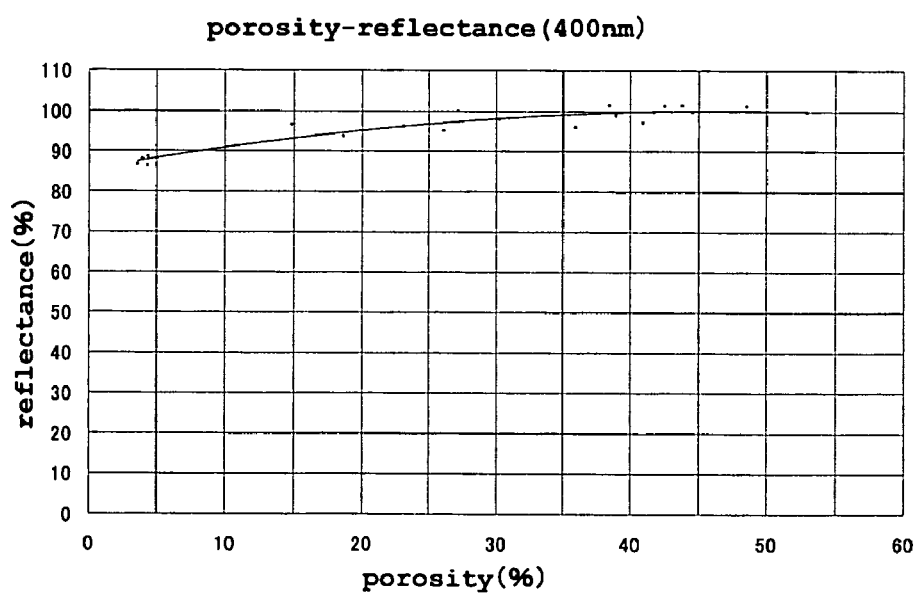
FIG. 10 is a graph showing the relationship between a pore diameter and the reflectance with respect to light having a wavelength of 400 nm.
Figure 11:
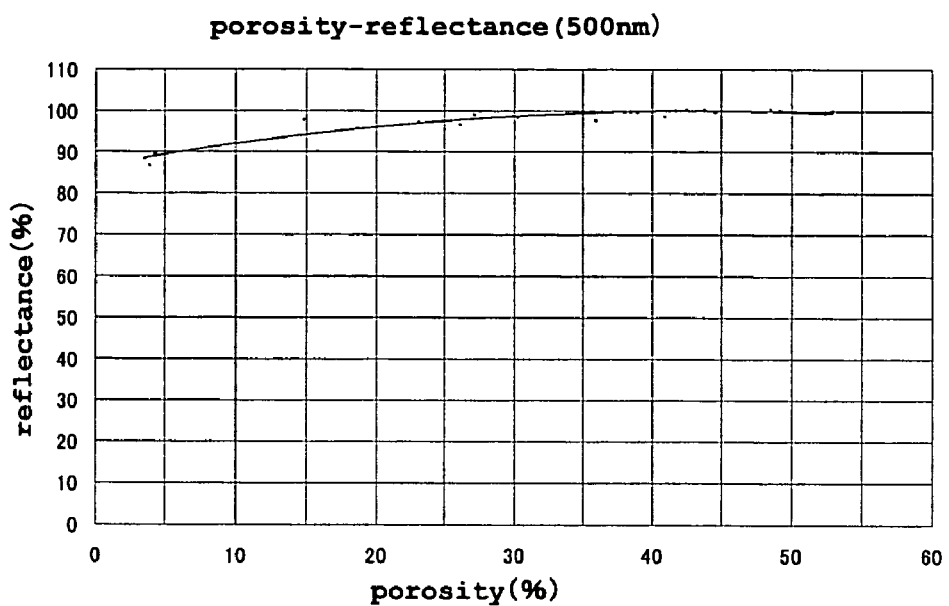
FIG. 11 is a graph showing the relationship between a pore diameter and the reflectance with respect to light having a wavelength of 500 nm.
Figure 12:
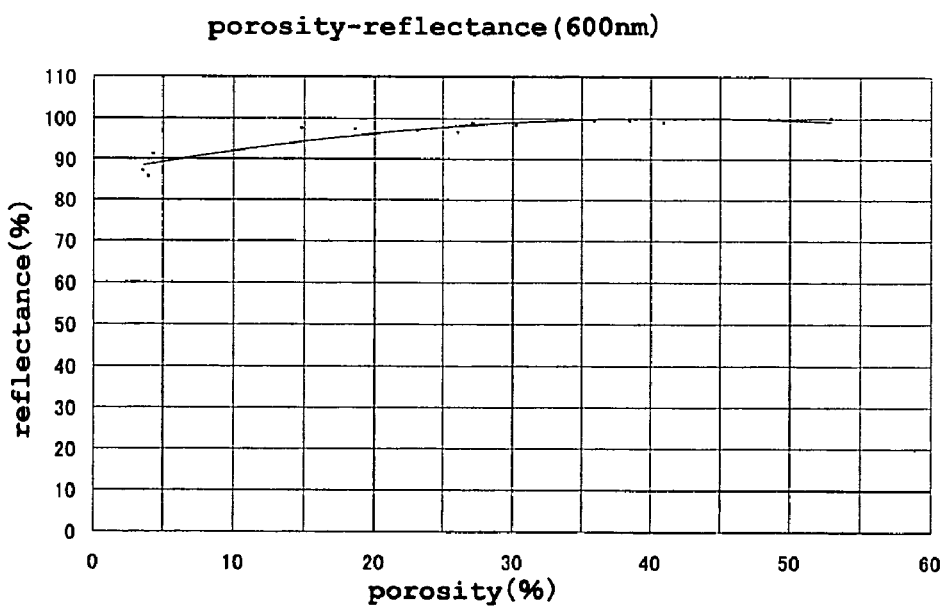
FIG. 12 is a graph showing the relationship between a pore diameter and the reflectance with respect to light having a wavelength of 600 nm.

A light emitting diode 1 according to an embodiment of the present invention is, as shown in FIG. 1 and FIG. 2, constituted of a light emitting diode package 4 which is formed by laminating a base body 2 and a cover body 3 which are formed of two rectangular-plate-like alumina ceramics, and a light emitting diode element 5 which is mounted on an upper surface of the base body 2 of the light emitting diode package 4.

The light emitting diode element 5 is connected to an approximately center portion of a surface of the base body 2 by die bonding using a silver paste or other high thermally conductive paste (omitted from the drawing) and, at the same time, electrodes which are formed on the surface of the base body 2 and electrodes (a cathode electrode and an anode electrode) which are formed on a surface of the light emitting diode element 5 are connected to each other using gold lines 6 by wire bonding. Here, in the above-mentioned light emitting diode 1, the electrodes formed on the surface of the light emitting diode element 5 are connected to the electrodes formed on the surface of the base body 2 by wire bonding. However, the bonding of these electrodes is not limited to such a bonding mode and electrodes (a cathode electrode and an anode electrode) which are formed on a back surface of the light emitting diode element 5 may be connected to electrodes which are formed on the surface of the base body 2 by die bonding.

Further, eight thermal vias 7 having the structure in which metal is filled in a through hole are formed at an approximately center portion of the base body 2.

The thermal vias 7 are formed at a position right below the light emitting diode element 5 which is mounted on the base body 2, and a back surface of the light emitting diode element 5 is connected to upper surfaces of the thermal vias 7 by die bonding, wherein the back surface of the light emitting diode element 5 and the upper surface of the thermal vias 7 are connected with each other by way of a high thermally conductive paste.

In the cover body 3, an opening 8 which is formed of a tapered hole having a inclined peripheral surface (tapered surface) which has a diameter thereof gradually increased from a back surface to a front surface is formed in an approximately center portion thereof, and a reflecting surface 9 is formed on the surface of the opening 8.

Then, the light emitting diode 1 emits the light radiated from the light emitting diode element 5 to the outside from the opening 8 formed in the cover body 3. Here, the light radiated sideward from the light emitting diode element 5 reflects on the reflecting surface 9 of the cover body 3 and is radiated to the outside from the opening 8 formed in the cover body 3, and the light radiated downwardly from the light emitting diode element 5 is reflected on the surface of the base body 2 and is radiated to the outside from the opening 8 formed in the cover body 3.

Accordingly, in the above-mentioned light emitting diode 1, the light is reflected not only on the reflecting surface 9 of the cover body 3 but also on the surface of the base body 2 and hence, the base body 2 also has a function of a reflector.

The base body 2 and the cover body 3 which function as the reflectors are formed using alumina ceramics which have a pore diameter of 0.10 to 1.25 μm or porosity of 10% or more.

Due to such a constitution, the base body 2 and the cover body 3 can enhance the reflectance of alumina ceramics per se compared to a case in which existing alumina ceramics which are baked at a predetermined baking temperature are used whereby the luminance of the light emitting diode 1 is enhanced.

That is, by changing the raw material composition before baking or the baking temperature at the time of baking or by mixing organic materials in the raw material, the pore diameter or the porosity of alumina ceramics after baking is changed. When the pore diameter or the porosity is changed, the reflectance is changed corresponding to the change of the pore diameter or the porosity. Here, alumina ceramics which possess the pore diameter or the porosity within a predetermined range can largely enhance the reflectance compared to the existing alumina ceramics.

The relationship between the pore diameter or the porosity of alumina ceramics and the reflectance is explained hereinafter. Here, alumina ceramics means ceramics in which the content of Alumina ($Al_2O_3$) amounts to 30 weight % or more.

weight % of alumina respectively at temperatures of 1200° C., 1380° C., 1492° C., and sample numbers No. 10 to No. 12 are formed by baking raw materials containing 99.7 weight % of alumina respectively at temperatures of 1200° C., 1380° C., 1492° C. respectively, wherein these alumina ceramics are formed by baking by changing the raw material composition before baking and the baking temperature at the time of baking. Here, the alumina ceramics of the sample number No. 9 is popularly and generally used alumina ceramics.

Further, the reflectance is measured based on a diffusion reflection measuring method using a spectrophotometer made by SHIMADZU Corporation UV-3150, MPC-3100.

The measurement result of respective samples is shown in Table 1. Here, to consider the measurement result of the sample number No. 9 in Table 1, it is understood that usual alumina ceramics exhibit the pore diameter of 0.02 μm, the porosity of 3.9%, and the reflectance of 60% at 300 nm and 85% or less at 350 nm.

TABLE 1

| Sample number | Pore volume (cm³/g) | Pore diameter (μm) | Bulk density (g/cm³) | Porosity (%) | Reflectance (%) | | | | |
|---|---|---|---|---|---|---|---|---|---|
| | | | | | 300 (nm) | 350 (nm) | 400 (nm) | 500 (nm) | 600 (nm) |
| No. 1 | 0.2840 | 0.94 | 1.86 | 52.94 | 80.0 | 94.6 | 99.7 | 100.0 | 100.1 |
| No. 2 | 0.2021 | 1.19 | 2.21 | 44.56 | 83.5 | 94.6 | 99.8 | 99.7 | 100.0 |
| No. 3 | 0.1092 | 1.27 | 2.77 | 30.26 | 70.7 | 89.4 | 98.0 | 98.5 | 98.3 |
| No. 4 | 0.2437 | 0.89 | 2.02 | 49.21 | 81.9 | 95.0 | 100.0 | 100.1 | 99.9 |
| No. 5 | 0.1716 | 1.13 | 2.38 | 40.90 | 76.9 | 92.5 | 97.2 | 98.6 | 98.9 |
| No. 6 | 0.0866 | 1.24 | 2.95 | 26.11 | 64.1 | 86.5 | 95.0 | 96.6 | 96.5 |
| No. 7 | 0.1855 | 0.43 | 2.29 | 42.53 | 81.9 | 98.5 | 101.3 | 100.3 | 99.9 |
| No. 8 | 0.0930 | 0.43 | 2.92 | 27.14 | 83.2 | 96.1 | 100.1 | 99.0 | 98.8 |
| No. 9 | 0.0109 | 0.02 | 3.60 | 3.92 | 60.0 | 84.2 | 88.0 | 86.7 | 85.7 |
| No. 10 | 0.2372 | 0.49 | 2.05 | 48.54 | 94.3 | 99.7 | 101.3 | 100.3 | 99.9 |
| No. 11 | 0.1952 | 0.46 | 2.24 | 43.80 | 96.6 | 100.1 | 101.4 | 100.2 | 99.9 |
| No. 12 | 0.1535 | 0.45 | 2.51 | 38.46 | 96.2 | 100.7 | 101.4 | 99.8 | 99.4 |
| No. 13 | 0.1643 | 0.18 | 2.37 | 38.91 | 85.3 | 95.1 | 98.9 | 99.6 | 99.7 |
| No. 14 | 0.0446 | 0.15 | 3.32 | 14.80 | 73.2 | 90.3 | 96.6 | 97.8 | 97.5 |
| No. 15 | 0.0096 | 0.02 | 3.68 | 3.53 | 48.2 | 76.2 | 86.7 | 88.2 | 87.1 |
| No. 16 | 0.1775 | 0.44 | 2.35 | 41.73 | 83.0 | 95.2 | 99.8 | 100.1 | 99.8 |
| No. 17 | 0.0755 | 0.45 | 3.06 | 23.13 | 71.6 | 90.5 | 96.2 | 97.2 | 96.9 |
| No. 18 | 0.0122 | 0.03 | 3.54 | 4.31 | 50.8 | 80.4 | 88.5 | 89.6 | 88.8 |
| No. 19 | 0.1434 | 0.15 | 2.50 | 35.91 | 83.7 | 92.0 | 96.0 | 97.7 | 99.3 |
| No. 20 | 0.0587 | 0.12 | 3.18 | 18.64 | 74.9 | 88.0 | 93.7 | 95.6 | 97.3 |
| No. 21 | 0.0111 | 0.02 | 3.87 | 4.30 | 62.8 | 75.6 | 86.3 | 89.1 | 91.2 |

First of all, by changing the raw material composition of alumina ceramics before baking or the baking temperature of alumina ceramics at the time of baking, 21 kinds of samples which differ in the pore diameter or the porosity from each other are manufactured, and the pore diameter, the porosity and the reflectance for every wavelength are measured for each sample. Here, as the reflectance, the reflectance of the diffusion reflection is measured instead of the so-called mirror face reflection.

Here, for example, a sample number No. 1 is formed by baking spherical alumina having a particle size of 10 μm at a temperature of 1200° C., a sample number No. 2 is also formed by baking spherical alumina having a particle size of 10 μm at a temperature of 1380° C., and a sample number No. 3 is also formed by baking spherical alumina having a same particle size of 10 μM at a temperature of 1492° C. Further, a sample number No. 4 is formed by baking spherical alumina having a particle size of 40 μm at a temperature of 1200° C., a sample number No. 5 is also formed by baking spherical alumina having a same particle size of 40 μm at a temperature of 1380° C., and a sample number No. 6 is also formed by baking spherical alumina having a same particle size of 40 μm at a temperature of 1492° C. Still further, sample numbers No. 7 to No. 9 are formed by baking raw materials containing 96

Figure 13:
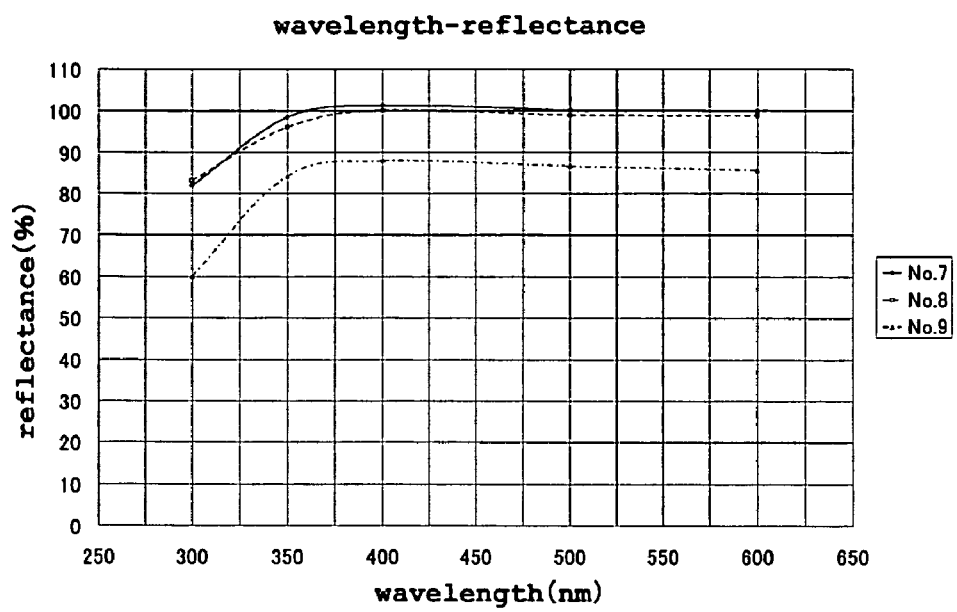
FIG. 13 is a graph showing the relationship between a wavelength of light and the reflectance.
Figure 14:
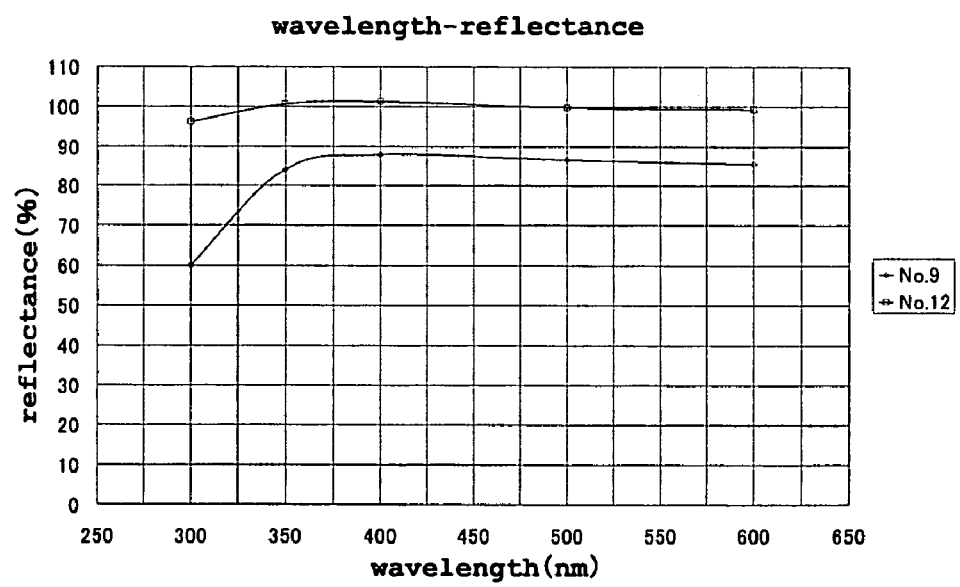
FIG. 14 is a graph showing the relationship between a wavelength of light and the reflectance.

Graphs which indicate the relationship between the pore diameter and the reflectance with respect to respective wavelengths which are prepared based on the measurement result shown in Table 1 are shown in FIG. 3 to FIG. 7. Further, graphs which indicate the relationship between the porosity and the reflectance with respect to respective wavelengths which are prepared based on the measurement result shown in Table 1 are shown in FIG. 8 to FIG. 12. Further, graph which shows the relationship between the wavelength and the reflectance with respect to samples consisting of the sample numbers No. 7 to No. 9 as typical examples is shown in FIG. 13, and a graph which indicates the relationship between the wavelength and the reflectance with respect to the samples consisting of the numbers No. 9 and No. 12 is shown in FIG. 14. Here, the reflectance is expressed as a numerical value when the reflectance of barium sulfate is set to 100% and hence, there exist values which exceed 100% as the reflectance.

First of all, to consider the relationship between the pore diameter and the reflectance with respect to the respective wavelengths shown in FIG. 3 to FIG. 7, it is understood as follows. That is, the reflectance exhibits a peak value in the vicinity of the pore diameter of approximately 0.7 μm in all wavelengths. Further, from FIG. 4 which shows the relationship between the pore diameter and the reflectance with respect to the wavelength of 350 nm which falls within a range of ultraviolet region, when the pore diameter of alumina ceramics is 0.10 to 1.25 µm, the reflectance which exceeds 85% which is the reflectance of usual alumina ceramics is obtained, when the pore diameter of alumina ceramics is 0.17 to 1.20 µm, the reflectance which exceeds 90% is obtained, and particularly, when the pore diameter of alumina ceramics is 0.34 to 1.08 µm, the reflectance which exceeds 95% is obtained and, further when the pore diameter of alumina ceramics is 0.60 to 0.80 µm, the reflectance which is substantially close to the peak value is obtained. Further, when the pore diameter of alumina ceramics is 0.10 to 1.25 µm, the reflectance of 85% or more is obtained also with respect to the wavelength which is 350 nm or more, and the reflectance exceeds 65% even with respect to the wavelength of 300 nm.

That is, when the pore diameter of alumina ceramics is set to 0.10 to 1.25 µm, alumina ceramics exhibit the extremely high reflectance in a visible region and, at the same time, exhibit the high reflectance even in the ultraviolet region.

Accordingly, it is understood that by setting the pore diameter of alumina ceramics to 0.10 to 1.25 µm, the reflectance of alumina ceramics can be largely enhanced. Here, it is understood that by setting the pore diameter of alumina ceramics to 0.17 to 1.20 µm, 0.34 to 1.08 µm, and 0.60 to 1.80 µm, the reflectance can be further enhanced.

Next, to consider the relationship between the porosity and the reflectance with respect to the respective wavelengths shown in FIG. 8 to FIG. 12, it is understood as follows. That is, the reflectance exhibits a peak in the vicinity of the porosity of approximately 40 to 50% with respect to all wavelengths. Further, from FIG. 9 which shows the relationship between the porosity and the reflectance with respect to the wavelength of 350 nm which falls within the ultraviolet region, when the porosity of alumina ceramics is 10% ore more, the reflectance which exceeds 85% which is the reflectance of usual alumina ceramics is obtained, when the porosity of alumina ceramics is 20% ore more, the reflectance which exceeds 90% is obtained, and particularly, when the porosity of alumina ceramics is 35% ore more, the reflectance which exceeds 95% is obtained and, further when the porosity of alumina ceramics is 40% or more, the reflectance which is substantially close to the peak value is obtained. Further, when the porosity of alumina ceramics is 10% or more, the reflectance of 85% or more is obtained also with respect to the wavelength which is 350 nm or more, and the reflectance exceeds 65% even with respect to the wavelength of 300 nm.

That is, when the porosity of alumina ceramics is set to 10% or more, alumina ceramics exhibit the extremely high reflectance in a visible region and, at the same time, exhibit the high reflectance even in the ultraviolet region.

Accordingly, it is understood that by setting the porosity of alumina ceramics to 10% or more, the reflectance of alumina ceramics can be largely enhanced. Here, it is understood that by setting the porosity of alumina ceramics to 20% or more, 35% or more, and 40% or more, the reflectance can be further enhanced.

Here, it is expected that when the porosity of alumina ceramics is set to 60% or more, the reflectance is decreased. However, when the porosity is excessively increased, a strength of alumina ceramics is decreased thus giving rise to a drawback with respect to a practical use thereof. Accordingly, provided that a practical strength is ensured, it is possible to obtain the sufficiently high reflectance by setting the porosity to 10% or more.

Next, to consider the relationship between the wavelength and the reflectance shown in FIG. 13, when the pore diameter of the alumina ceramics is 0.02 µm and hence dose not fall within a range of 0.0.10 to 1.25 µm or when the porosity is 3.92% and hence does not fall in a range above 10% including 10% as in the case of the sample number No. 9, the reflectance is 90% or less with respect to all wavelengths. Further, at the wavelength shorter than approximately 400 nm which is an upper limit of the ultraviolet ray region, the reflectance is decreased and the reflectance is decreased to 60% at the wavelength of 300 nm. To the contrary, as in the case of the sample number No. 7 and the sample number No. 8, the alumina ceramics having the pore diameter within a range of 0.10 to 1.25 µm and the porosity within a range of above 10% including 10%, the reflectance is 90% or more, that is, is extremely high with respect to the wavelength above 325 nm which falls in the ultraviolet ray region. Further, even with respect to the wavelength of 300 nm, the reflectance is yet held at a high value exceeding 70%.

From the above, it is understood that by setting the pore diameter of alumina ceramics to 0.10 to 1.25 µm or by setting the porosity of alumina ceramics to 10% or more, it is possible to largely enhance the reflectance of alumina ceramics.

Further, the sample numbers No. 7 to No. 9 are alumina ceramics which differ only in the baking temperature, that is, 1200° C., 1380° C., 1492° C. (baking temperature) respectively while setting the weight ratio of alumina in the raw material as 96%. In this manner, alumina ceramics are manufactured using a usual baking furnace by merely baking at the temperatures lower than the usual sintering temperature without changing the composition of the raw material and the additive agents and hence, it is possible to enhance the reflectance of alumina ceramics without incurring the increase of the manufacturing cost.

Next, to consider the relationship between the wavelength and the reflectance shown in FIG. 14, with respect to the sample number No. 9 in which the purity of alumina ceramics is 96%, the pore diameter of the alumina ceramics is 0.02 µm and hence does not fall within a range of 0.10 to 1.25 µm or when the porosity is 3.92% and hence does not fall in a range above 10% including 10%, the reflectance is 90% or less with respect to all wavelengths. Further, at the wavelength shorter than approximately 400 nm which is an upper limit of the ultraviolet ray region, the reflectance is decreased and the reflectance is decreased to 60% at the wavelength of 300 nm. To the contrary, as in the case of the sample number No. 12 in which the purity of alumina ceramics is 99.7%, when the pore diameter of alumina ceramics falls within a range of 0.10 to 1.25 µm, the porosity of alumina ceramics becomes within a range of above 10% including 10%, and the reflectance is 90% or more, that is, is extremely high with respect to the wavelength of 325 nm or above which falls in the ultraviolet ray region. Further, even with respect to the wavelength of 300 nm, the reflectance is yet held at a high value exceeding 70%.

To compare these sample number No. 9 and the sample number No. 12, the sample numbers No. 9 to No. 12 are alumina ceramics which differ only in the weight ratio of alumina in the raw material, that is, 96% and 99.7% respectively. In this manner, alumina ceramics are manufactured using a usual baking furnace by merely increasing the purity of alumina ceramics without adding an additive agent to the raw material and hence, it is possible to easily enhance the reflectance of alumina ceramics by merely increasing the purity of alumina ceramics.

As has been explained above, with respect to the usual alumina ceramics, since the pore diameter is 0.10 µm or less and the porosity is 10% or less, the reflectance of the alumina ceramics is 90% or less with respect to the respective wavelengths. To the contrary, in the present invention, by setting the pore diameter of alumina ceramics to 0.10 to 1.25 µm or by setting the porosity of alumina ceramics to 10% or more, it is possible to largely enhance the reflectance of the alumina ceramics per se compared to the generally popular alumina ceramics.

Accordingly, when alumina ceramics having the pore diameter of 0.10 to 1.25 μm or the porosity of 10% or more are used as a reflector of various light sources, it is possible to enhance the reflectance. Further, when the alumina ceramics having the pore diameter of 0.10 to 1.25 μm or the porosity of 10% or more are used as a reflector of the package of the light emitting diode, it is possible to increase the luminance of the light emitting diode. Particularly, with respect to the light emitting diode of blue which has a short wavelength or the light emitting diode which radiates light in the ultraviolet ray region, the above-mentioned advantageous effect becomes apparent.

Further, it is possible to set the pore diameter of alumina ceramics to 0.10 to 1.25 μm and the porosity of alumina ceramics to 10% or more by merely changing the baking temperature and hence, the enhancement of reflectance does not induce the increase of the manufacturing cost of alumina ceramics.

In this manner, in the above-mentioned light emitting diode 1 or the package 4 thereof, by using alumina ceramics which enhance the reflectance by setting the pore diameter of alumina ceramics to 0.10 to 1.25 μm and the porosity of alumina ceramics to 10% or more as a material of members which function as reflectors for reflecting light radiated from the light emitting diode element 5 (the base body 2 and the cover body 3 in the above-mentioned light emitting diode 1), it is possible to enhance the luminance of the light emitting diode 1.

Particularly, in the above-mentioned light emitting diode 1 or the package 4 thereof, alumina ceramics which enhance the reflectance are used as the base body 2 and the light emitting diode element 5 is arranged above the base body 2 and hence, it is also possible to favorably reflect the light which is directed downwardly from the light emitting diode element 5 and hence, the luminance of the light emitting diode 1 can be enhanced.

Further, when the pore diameter and the porosity of alumina ceramics are increased, due to the decrease of the thermal conductivity of alumina ceramics per se, there exists a possibility that the heat radiation characteristics of the light emitting diode 1 or the package 4 thereof are lowered. However, in the above-mentioned light emitting diode 1 or the package 4 thereof, the thermal vias 7 are formed in the base body 2 and hence, it is possible to enhance the heat radiation characteristics of the light emitting diode 1 and the light emitting diode package 4 thereof.

Further, in the above-mentioned light emitting diode 1 or the package 4 thereof, the thermal vias 7 are formed at the position right below the light emitting diode element 5 and hence, a distance between the light emitting diode element 5 and the thermal vias 7 can be shortened and hence, heat generated by the light emitting diode element 5 can be readily transferred to the thermal vias 7 whereby the heat radiating characteristics of the light emitting diode 1 or the light emitting diode package 4 can be further enhanced.

Figure 15:
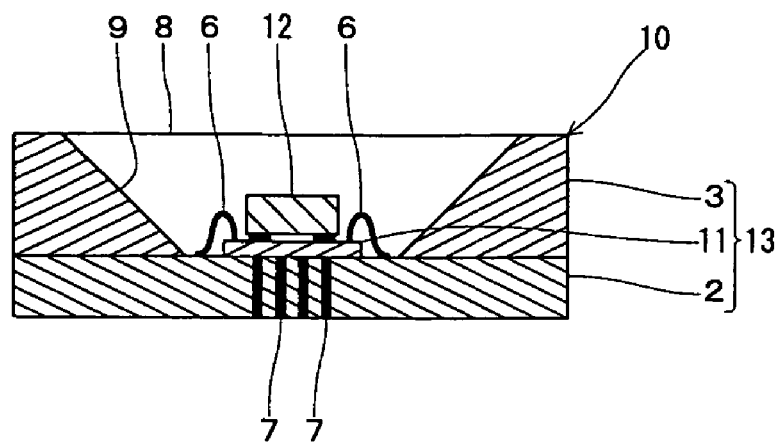
FIG. 15 is a cross-sectional view showing a light emitting diode of another embodiment.

In the above-mentioned light emitting diode 1, the electrodes on the surface of the light emitting diode element 5 are connected to the surface of the base body 2 by wire bonding. However, the present invention is not limited to such electrode connection. As in the case of a light emitting diode 10 shown in FIG. 15, a rectangular-plate-like heat radiating body 11 having high thermal conductivity made of aluminum nitride or metal may be mounted at a position right above thermal vias 7 formed on the base body 2, and a light emitting diode element 12 may be mounted on the heat radiating body 11. In this case, the light emitting diode package 13 may be constituted of the base body 2, the cover body 3 and the heat radiating body 11.

In this manner, when the light emitting diode element 12 is mounted on the base body 2 by way of the heat radiating body 11 made of a material having the thermal conductivity higher than the thermal conductivity of the base body 2, heat generated by the light emitting diode element 12 can be favorably transferred to the thermal vias 7 whereby it is also possible to further enhance the heat radiating characteristics of the light emitting diode 10 or the light emitting diode package 13 thereof.

Here, in the light emitting diode 1, 10 or the package 4, 13 having the above-mentioned structure, alumina ceramics which enhance the reflectance by setting the pore diameter to 0.10 to 1.25 μm and the porosity to 10% or more is used as the material of the base body 2 and the cover body 3. However, alumina ceramics which improve the reflectance may be used as the material of the base body 2, while usual alumina ceramics, resin or the like may be used as the material of the cover body 3.

What is claimed is:

1. A light emitting diode package comprising,
   a base body for mounting a light emitting diode element, said base body being formed of alumina ceramic having a pore diameter of 0.10 to 1.25 μm, said base body having a front surface and a back surface so that the light emitting diode element is mounted on the front surface;
   a cover body attached to the front surface of the base body, said cover body including an opening portion having a reflecting surface; and
   a thermal via formed in the base body and passing through the base body from the front surface to the back surface so that one end portion of the terminal via is exposed from the back surface.

2. A light emitting diode package comprising,
   a base body for mounting a light emitting diode element, said base body being formed of alumina ceramic having a porosity of 10% or more, said base body having a front surface and a back surface so that the light emitting diode element is mounted on the front surface;
   a cover body attached to the front surface of the base body, said cover body including an opening portion having a reflecting surface; and
   a thermal via formed in the base body and passing through the base body from the front surface to the back surface so that one end portion of the terminal via is exposed from the back surface.

3. A light emitting diode package according to claim 1, wherein said thermal via is formed at a position of the base body on which the light emitting diode element is to be mounted so that the other end portion of the thermal via contacts with the light emitting diode element when the light emitting diode element is mounted on the front surface.

4. A light emitting diode package according to claim 2, wherein said thermal via is formed at a position of the base body on which the light emitting diode element is to be mounted so that the other end portion of the thermal via contacts with the light emitting diode element when the light emitting diode element is mounted on the front surface.

5. A light emitting diode package according to claim 1, further comprising a heat radiating body disposed between the base body and the light emitting diode element to be mounted thereon.

6. A light emitting diode package according to claim 2, further comprising a heat radiating body disposed between the base body and the light emitting diode element to be mounted thereon.

7. A light emitting diode package according to claim 1, wherein said reflecting surface is formed on a slope surrounding the opening portion and inclined relative to a thickness direction of the base body.

8. A light emitting diode package according to claim 2, wherein said reflecting surface is formed on a slope surrounding the opening portion and inclined relative to a thickness direction of the base body.

9. A light emitting diode mounted on the light emitting diode package according to claim 1.

10. A light emitting diode mounted on the light emitting diode package according to claim 2, 11. A light emitting diode package according to claim 1, wherein said thermal via is formed in the base body so that the other end portion of the thermal via contacts with the light emitting diode element with a thermally conductive paste in between when the light emitting diode element is mounted on the front surface.

12. A light emitting diode package according to claim 2, wherein said thermal via is formed in the base body so that the other end portion of the thermal via contacts with the light emitting diode element with a thermally conductive paste in between when the light emitting diode element is mounted on the front surface.

* * * * *